United States Patent [19]

Kondraske

[11] Patent Number: 4,873,655

[45] Date of Patent: Oct. 10, 1989

[54] SENSOR CONDITIONING METHOD AND APPARATUS

[75] Inventor: George V. Kondraske, Arlington, Tex.

[73] Assignee: Board of Regents, The University of Texas System, Austin, Tex.

[21] Appl. No.: 88,087

[22] Filed: Aug. 21, 1987

[51] Int. Cl.[4] ............................................. G01R 7/10
[52] U.S. Cl. ................................ 364/553; 364/571.02; 364/571.07; 73/1 R; 324/207
[58] Field of Search ............... 364/553, 571, 573, 582, 364/577, 723, 571.02, 571.07; 73/1 R; 324/207

[56] References Cited

U.S. PATENT DOCUMENTS

| | | | |
|---|---|---|---|
| 4,253,155 | 2/1981 | Freiday et al. | 364/573 |
| 4,403,296 | 9/1983 | Prosky | 364/573 |
| 4,481,596 | 11/1984 | Townzen | 364/571 |
| 4,581,714 | 4/1986 | Reid | 364/571 |

FOREIGN PATENT DOCUMENTS 2072349 3/1980 United Kingdom .

OTHER PUBLICATIONS

Kondraske et al., "A Microprocessor-Based System for Adaptable Calibration and Linearization of Hall-Effect Position Sensor," Sep. 1986, pp. 338–343.

Primary Examiner—Parshotam S. Lall
Assistant Examiner—Ellis B. Ramirez
Attorney, Agent, or Firm—Arnold, White & Durkee

[57] ABSTRACT

An adaptable method and apparatus for calibrating and conditioning sensor output to conform to a desired transfer function is provided. In one form, the invention allows use of a sensor system having nonlinear output characteristics when measuring a physical quantity and provides a response which varies linearly to changes in the physical quantity. In the calibration phase, a look-up table is built based on inputs from the sensor system and a reference transducer which behaves in the desired fashion to changes in the physical quantity. In the operation phase, the sensor system measures the unknown physical quantity and enters the look-up table to determine a corresponding reference value. Thus, the present invention adapts a sensor system to an application without restrictive considerations to individualized operating performance of the sensor system or environment of the application.

21 Claims, 5 Drawing Sheets

SENSOR CONDITIONING METHOD AND APPARATUS

BACKGROUND OF THE INVENTION

1. Field of the Invention

This invention relates to an adaptable method and apparatus for conditioning the output of a sensor to a desired output transfer function. In one form, the present invention relates to a method for linearizing the output of a sensor which behaves in a nonlinear fashion to changes in a physical quantity being measured.

2. Description of the Relevant Art

The use of sensors in a variety of control applications is increasing at a dramatic rate. For example, in many fields such as robotics, biomedical, and manufacturing, sensors are used to provide feedback to a control system as to position, displacement, temperature, force, or acceleration. The use of noninvasive sensors in which the sensor does not affect the physical quantity being measured is increasing.

A fundamental difficulty in using sensors is that the sensor output must be predictable and desirable for the physical quantity being measured. Typically, sensors are fabricated using costly and tightly controlled manufacturing techniques to produce a sensor with known performance characteristics. The sensor manufacturer analyzes and publishes the operating characteristics and tolerances of the sensor, but cannot usually adequately account for the many variables which affect sensor operation.

It is important that the sensor behave not only in a predictable manner, but also in a desirable fashion. In many applications it is desirable that the sensor output bear a linear relationship to changes in the physical quantity being measured. Indeed, the design of many engineering systems relies upon an assumption that sensor output bears a linear relationship to variations in a physical quantity being measured. Unfortunately, many types of sensors do not perform linearly due to either the nature of the inherent physical principle or mobility to control all manufacturing tolerances to ideal specifications.

Many popular types of sensors such as Hall-Effect position sensors, thermistor, capacitive sensors, and strain gauge - are inherently nonlinear. That is, the sensor output follows a nonlinear transfer function in response to changes in the physical quantity being measured. Even sensors which might be categorized as inherently linear have outputs which are sometimes difficult to predict over certain portions of their dynamic range. Therefore, the outputs of both inherently linear and inherently nonlinear sensors may vary in somewhat unpredictable and undesirable fashion over certain dynamic ranges of the physical quantity being measured.

A variety of techniques have been developed to attempt to overcome the problem of sensors nonlinearity. One such method is to employ an analog compensation circuit which applies an inverse transfer function to the output of the sensor to achieve a linear characteristic. Some software methods have followed a similar approach in applying an inverse transfer function to the sensor output to achieve a system linearization. See, e.g., U.S. Pat. No. 4,581,714. A major drawback of such methods is that such compensation techniques require a prior detailed accounting of the input-output characteristic (an experimentally determined transfer characteristic) of the sensor in question and do not account for nonuniformity under certain conditions. Further, analog compensation circuits are often as problematic as the sensor-requiring high-tolerance components which are unstable for certain input conditions and are difficult to design and implement.

Typically, the sensor manufacturer determines and publishes the operating characteristics of the sensor over the normal operating range. Because such operating characteristics must be uniform for all sensors of a given type, very narrow tolerances (and concomitant high reject rate) and costly manufacturing must be applied to sensor fabrication. Whether or not the sensor performance characteristics are generally linear or nonlinear, many users apply analog correcting circuits to the sensor output. Thus, corrections for frequency response distortion, noise, parameter drift, or cross-sensitivity to temperature, magnetic field, or electric field, might be applied over a given operating range to the sensor.

A useful approach to the problem of obtaining the desired and predictable characteristic is to provide a separate ROM based look-up table which maps nonlinear sensor outputs to corresponding values on a linear scale in a microprocessor-based system. Such a ROM-based system must, however, be tailored to a particular sensor and is therefore most useful when used in one time prototype or research applications. If the same ROM based look-up table is intended to operate with multiple production samples of a given sensor type potentially unachievable rigid manufacturing tolerances must be employed when fabricating the sensor to allow one fixed ROM based look-up table used with all production pieces of such a sensor.

These problems are generally discussed in G. Kondraske and R. Ramaswamy, "A Microprocessor-Based System" *IEEE Trans. Instr. Meas.*, Vol. 3, pp. 338–43, Sept., 1986, and is incorporated herein by reference.

SUMMARY OF THE INVENTION

The problems outlined above are generally solved by the method and apparatus of the present invention which adapts a sensor for measuring a physical quantity notwithstanding undesirable or unpredictable performance characteristics of the sensor. Thus, the present invention contemplates using a sensor which does not behave in accordance with a desired fashion — i.e., linear — and adjusts sensor output to give the desired transfer function — i.e., linear output. Not only is the present invention effective in giving the desired output, but additionally the present invention significantly relaxes the tolerances on the performance characteristics on a type of sensor. Therefore, the cost of manufacture of such sensors incorporated in the adaptable system of the present invention is significantly reduced. Further, the present invention allows use of many types of sensors in a variety of applications otherwise unachievable.

Broadly speaking, the method of the present invention adjusts the output characteristics of a sensor or sensor system to conform to a desired transfer function, the adjustments occurring over the entire performance range of the sensor or over only the range where the normal output deviates from the entire transfer function. The physical quantity in an initial condition is measured with both the sensor and a reference transducer which has the desired transfer function. The condition of the physical quantity is varied over the range of interest and measurements are repeated with the sensor and reference transducer to determine offset and gain. Measurements are repeated and used to build a changeable look-up table where for each condition a sensor measurement corresponds to a reference transducer measurement.

After the look-up table is built, the system is ready to measure the physical quantity in an unknown condition using the sensor. The sensor measurement of the unknown physical quantity is adjusted in real time for offset and gain by entering the look-up table to determine a corresponding reference transducer measurement. The identified reference transducer measurement is output from the look-up table as indicative of the physical quantity in the unknown condition. Because the reference transducer measurement possesses the desired transfer function, the measurement output from the look-up table conforms to the desired transfer function.

Preferably, the method of the present invention linearizes the output of the sensor where the normal sensor output is a nonlinear function of the physical quantity being measured. Generally speaking, the linearization method contemplates first calibrating the system to build a changeable look-up table (e.g. in nonvolatile RAM or EEPROM) and then operating the system to determine a reference value corresponding to the physical quantity in an unknown condition. In calibrating the system, the physical quantity is varied over the range of interest or at least a representative range of conditions. The reference transducer is coupled to the physical quantity being measured and produces a reference value that is preferably a linear function of the changes in physical quantity. The physical quantity is measured by both the sensor and reference transducer with a sensor signal and reference value output to a look-up table for each condition. Thus, a look-up table is built with a unique reference value for each condition. The look-up table is "changeable" in that it can be recalibrated as desired.

In the operation phase, the reference transducer is omitted from the system — the sensor being used to measure the physical quantity in unknown conditions. With the physical quantity in an unknown condition, sensor signals are output to the look-up table. The signal is used as a pointer to enter the look-up table to determine a reference value corresponding to the sensor signal. This reference value is output from the look-up table. Changes in the physical quantity outputs reference values from the look-up table which vary linearly.

Preferably, the look-up table is constructed over the entire desired measurement range. The sample size during the calibration phase increases the size of the look-up table and hence the accuracy during the operation phase. In a preferred form, a reasonable sized look-up table is built during the operation phase and interpolation is used to approximate the remaining reference values in the look-up table. Of course, if the desired transfer function is linear output, a linear interpolation method is used. This method (linear interpolation) provides good accuracy if nonlinear characteristics are desired as well.

The apparatus of the present invention operates to calibrate and adjust a sensor which normally does not produce an output signal which varies in a desirable or predictable fashion to changes in the physical quantity being measured. The apparatus includes a reference transducer coupled to the physical quantity which produces an output which varies in the desired fashion to changes in the condition of the physical quantity. A microprocessor having a look-up table receives the digital values of the sensor signals and reference transducer outputs, and matches the signals and outputs for each physical quantity. The reference transducer is disconnected once the look-up table is built for measuring the physical quantity in an unknown condition with only the sensor. A display coupled to the microprocessor indicates the reference value determined using the sensor signal, and is indicative of the physical quantity in an unknown condition.

DETAILED DESCRIPTION OF THE PREFERRED EMBODIMENTS

Figure 1:
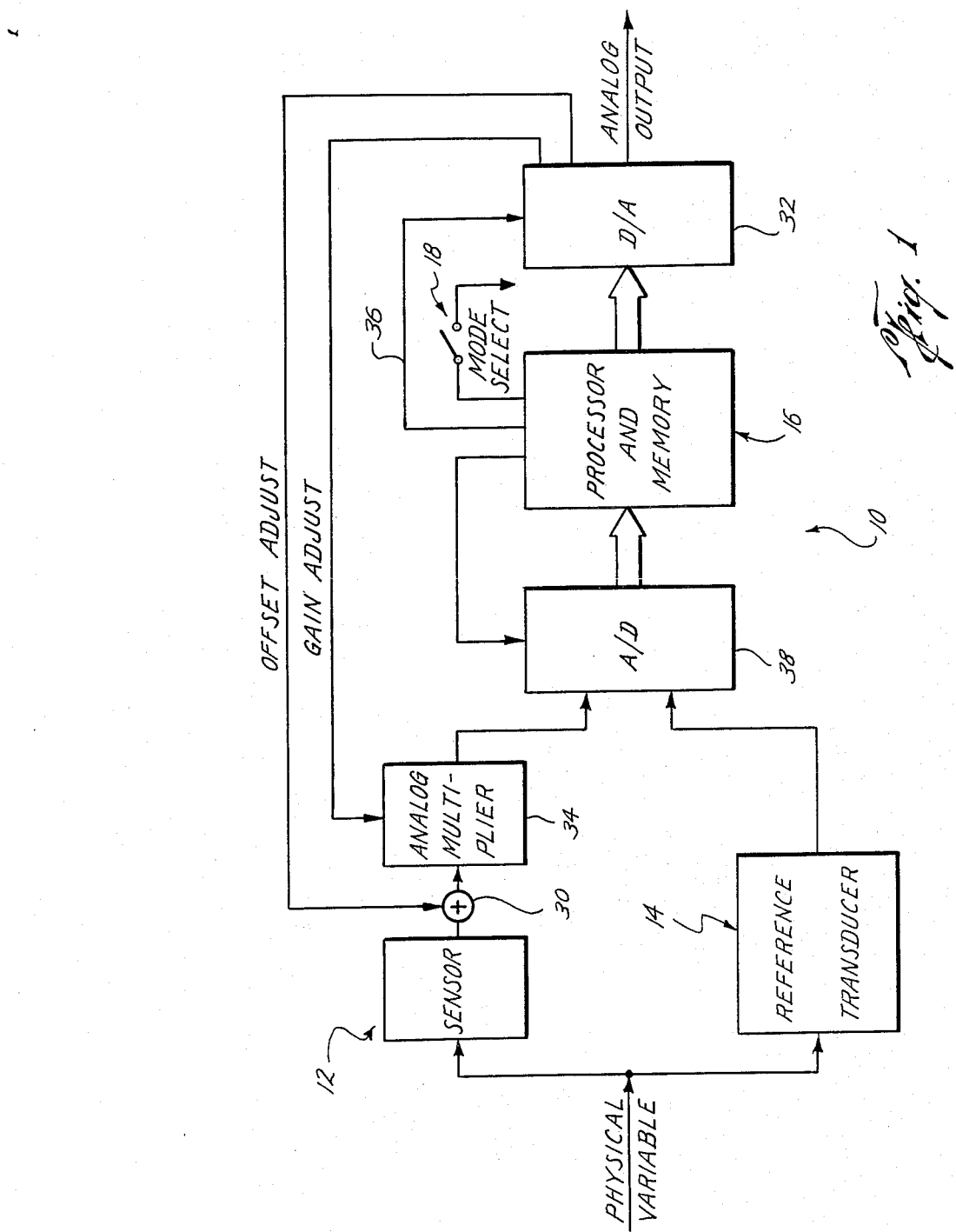
FIG. 1 is a schematic diagram of a preferred embodiment of the apparatus of the present invention in the calibrate mode.
Figure 2:
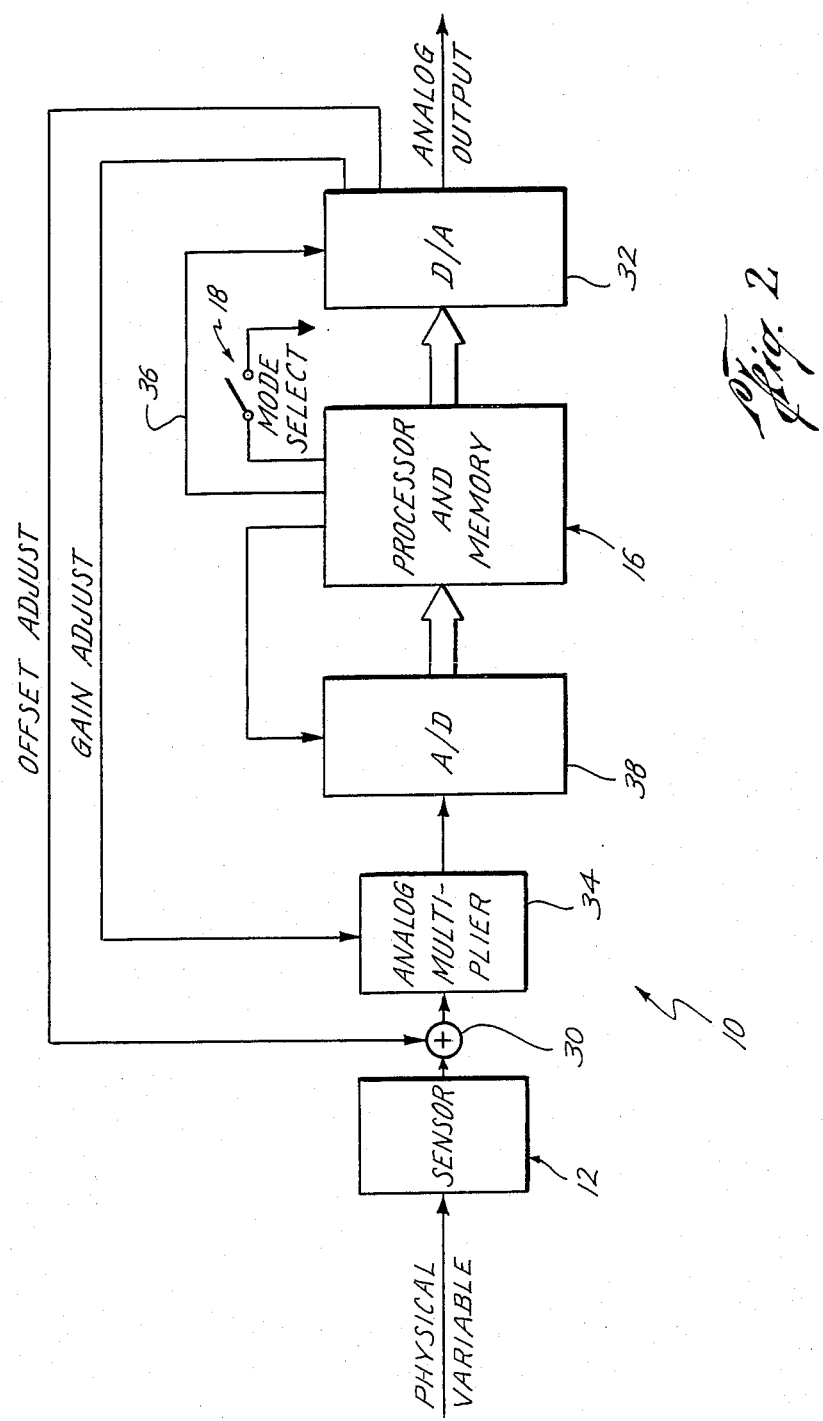
FIG. 2 is a schematic diagram of a preferred embodiment of the apparatus of the present invention in the operate mode.

Generally speaking, the apparatus 10 of the present invention (FIGS. 1 and 2) couples a sensor 12 and reference transducer 14 to a microprocessor 16. In the calibrate phase of operation, both the reference transducer 14 and sensor 12 measure the physical quantity (FIG. 1). However, in the normal operate mode of the apparatus 10, only the sensor 12 is used to measure the physical quantity (FIG. 2). A mode select switch or signal 18 is provided to change from the calibrate to the operate mode.

The apparatus 10 of the present invention is adaptable for use with practically any type of sensor 12. However, the apparatus 10 is intended for use with a sensor 12 which has unpredictable or undesirable operating characteristics, while a sensor with predictable or desirable operating characteristics would be used as the reference transducer 14. In most instances, the apparatus 10 is used to linearize the output of a sensor. Many types of sensors are inherently nonlinear (e.g. the capacitive, thermistor, Hall-Effect, strain gauge) and it is desirable to linearize the sensor output relative to changes in the physical quantity being measured. Even sensors which normally behave linearly may exhibit nonlinearities under certain conditions such as operating range, environment conditions, frequency of operation, etc. A further complication is that such nonlinearities, either over the entire operating range or under certain conditions, may not necessarily conform to the manufacturer's specifications (and are therefore unpredictable to at least a limited extent). Therefore, the apparatus 10 of the present invention is useful with practically any sensor 10, but is particularly useful with sensors having undesirable or unpredictable operating characteristics.

On the other hand, it is necessary that the reference transducer 14 be an accurate reflection of the physical quantity being measured. The reference transducer 14 must have the "desired transfer function" relative to the physical quantity being measured. In the context of the present invention, "desired transfer function" means only that the reference transducer will accurately reflect the physical quantity being measured under the conditions at the time of measurement (i.e. calibration). It is not necessary that the transfer function be known ahead of time (i.e. the characteristic input-output curve need not be consulted). In most applications, the "desired transfer function" is a linear relationship in that the outputs of the reference transducer vary linearly (change by a constant) to changes in the physical quantity being measured.

Broadly speaking, the operation of the apparatus 10 of the present invention is illustrated in FIGS. 1 and 2. FIG. 1 shows the apparatus 10 in the calibration mode in which both the reference transducer 14 and sensor 12 simultaneously measure the input physical quantity. Outputs of the reference transducer 14 and sensor 12 are digitized and fed to the processor 16 where a look-up table is prepared. Conceptually, the look-up table holds a sensor signal value and reference transducer output value for each different condition of the physical quantity. The physical quantity being measured is varied (preferably over the desired range) to build a look-up table of reasonable sample size. Generally speaking, the major constraint on the size of the look-up table is available memory. Many alternative techniques are available for building the look-up table besides actual sampling of the physical quantity. For example, look-up table memory can be filled by using interpolation between actual samples or extrapolation beyond the actual sampling limits of the physical quantity. As used herein, "reference values" refers to the look-up table values corresponding to the reference transducer outputs of actual sampling or generated by interpolation or extrapolation.

FIG. 2 shows the apparatus 10 of the present invention in the operate mode in which only the sensor 12 measures the physical quantity. In FIG. 2 the sensor signal is digitized and used as an address pointer to the memory location in the look-up table. The contents of the memory location — the reference values — are then displayed. If the reference transducer is selected for its desired transfer characteristics, then the output of the apparatus 10 during the operation phase will necessarily mimic the characteristics of the reference transducer. If the reference transducer behaves linearly, the apparatus 10 of the present invention will yield a linear output to variations in the physical quantity being measured.

EXAMPLE

The present invention is perhaps best understood by way of illustrative example. Many commonly used sensors have undesirable or unpredictable operating characteristics — for example sensor output varies nonlinearly to changes in the physical quantity being measured. For example, Hall-Effect sensors are desirable in many applications such as robotics or biomedical for sensing position. In biomedical applications, Hall-Effect sensors are not only inexpensive, but also are implantable and noninvasive. However, use of Hall-Effect sensors has been limited since the magnetic field changes produced by a position change of a magnetic source is nonlinear. Therefore, in most uses the output of the sensor must be linearized by some technique.

Figure 5A:
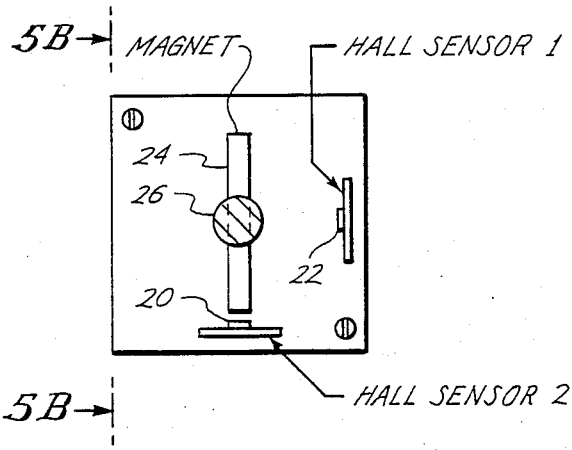
FIG. 5 (a) and (b) are elevational views of an illustrative embodiment of the present invention wherein the sensor system is a pair of Hall-Effect position sensors.
Figure 5B:
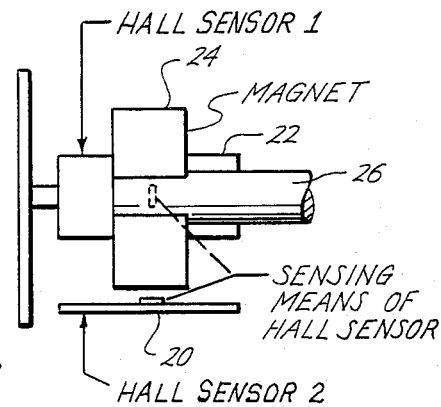

Turning to FIG. 5, a Hall-Effect position sensor system is illustrated in accordance with the present invention. As can be seen in FIG. 5, two Hall-Effect sensors 20, 22 are used to sense the position of the magnet 24. This is because as the bar magnet 24 rotates, the flux distribution about the axis of rotation changes approximately sinusoidally. Of course, sinusoids do not yield a unique magnitude for every position over a 360 rotation range. Therefore, it is not possible to determine absolute angular position of the bar magnet 24 of FIG. 5 using a single Hall-Effect sensor, but requires two Hall-Effect sensors 20, 22 placed at right angles to each other about the axis of rotation.

In FIG. 5, a first Hall-Effect sensor 20 and a second Hall-Effect (Microswitch 92SS12-2) sensor 22 are placed at right angles concentrically about the axis of rotation of bar magnet 24 along an imaginary circle described by rotation of the magnet 24. A nonmetallic shaft 26 is coupled to the magnet 24 and is rotated by a small DC gear motor (not shown). An angular potentiometer (i.e. reference transducer) is ganged to the shaft 26 so that the shaft and potentiometer, all rotate together with the motor activated.

Turning to FIGS. 1 and 2, the microprocessor 16 (Intel 8031 with 4K bytes of external program memory) includes memory for a look-up table. In the present application 2K bytes of external data memory (Motorola 6116 CMOS Static RAM) was coupled to the on-chip data RAM of the microprocessors 16. While in FIG. 5 RAM is used for the look-up table, preferably nonvolatile RAM such as EEPROM would be used.

As shown in FIGS. 1 and 2, the programmable offset 30 requires the addition of a negative voltage to the Hall-Effect sensor signal, and is provided by an 8-bit D/A convertor 32 (National DAC 0830). The programmable gain 34 consists of a switchable gain inverting amplifier with four input resistors of values R, R/2, R/4 and R/8, selected by a quad analog switch. The microprocessor 16 controls the status of each switch pole of the quad switch via interrupt 36, allowing 15 different parallel combinations of the four resistors. Thus, with a feedback resistance of value R, the inverting amplifier 34 may be controlled to select any integer gain between 1 and 15.

Two channels of an 8-channel A/D convertor 38 (National ADC 0809) are used to digitize the Hall-Effect sensor signals and reference transducer 14 outputs. The digital values of the Hall-Effect sensor signals and reference transducer outputs are fed to the microprocessor 16 as shown in FIGS. 1 and 2.

Although FIGS. 1 and 2 show a single D to A convertor 32, another 8-bit D to A convertor is preferably used to provide an analog output of the reference value. Of course, a digital output might (e.g. a direct microprocessor interface) alternatively be provided.

Figure 3:
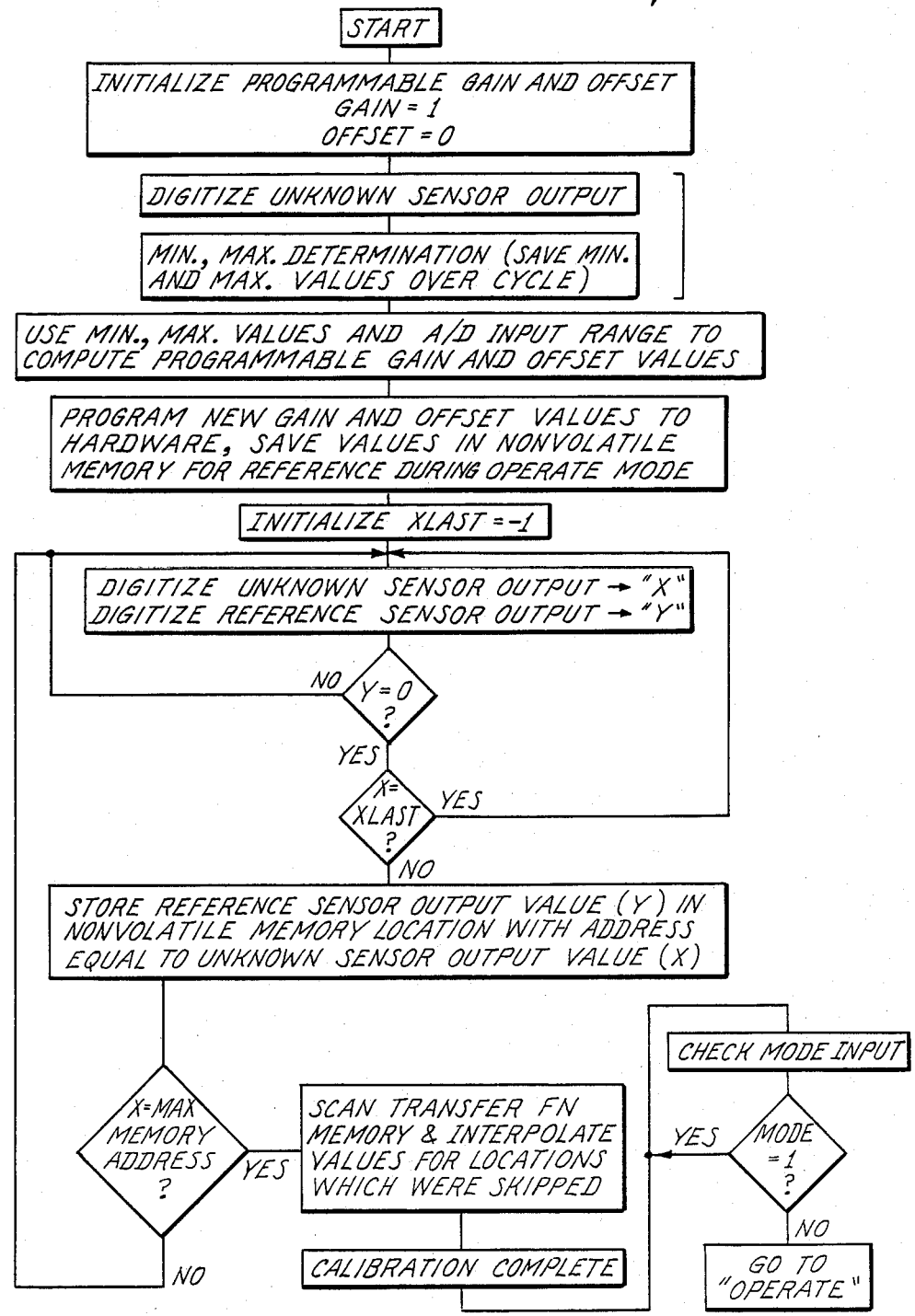
FIG. 3 is a flow chart of the present invention in the calibrate mode.

The apparatus 10 might be calibrated a number of times — e.g. at power up — to adapt the apparatus 10 to changing environmental conditions. FIGS. 1 and 3 relate to the calibration mode. Turning to FIG. 3, on power up, system parameters are initialized, setting unity gains and zero offset conditions to the offset and gain stages 30, 34. The DC motor is then set to an initial position and the microprocessor 16 enables the motor to rotate the shaft 26. As the shaft 26 rotates, the signals of the Hall-Effect sensors 20, 22 are repeatedly digitized and the maximum and minimum values stored in the microprocessor 16. See MIN, MAX, determination step in FIG. 3). Using the determined MIN, MAX values of the Hall-Effect sensor signals, the microprocessor 16 computes programmable gain and offset values to set up a second pass or sampling during the calibration phase. As seen in FIG. 3, these min. max. values are used to compute offset and gain values for use in the "operate" mode.

In the second pass during calibration, the shaft 26 is rotated in stepped intervals using the reference transducer 14 for feedback and microprocessor 16 control through the desired MIN-MAX range. At each step, the output of the Hall-Effect sensors 20, 22 are combined to form the address and the reference transducer value is stored in RAM, as shown in FIG. 3. Alternatively, the sensor signals can be stored in memory and memory searched to find the matching reference value.

The net result of the calibration stage is generation of a look-up table in which sensor signals are matched with reference transducer values. Because two Hall-Effect sensors 20, 22 are used, the look-up table in this example is represented by the values of two Hall-Effect sensor signals matched to a single reference transducer value. As previously mentioned, the reference values may not be representative of actual sampling, but might also be computed by the microprocessor 16 based upon interpolation or extrapolation.

Figure 4:
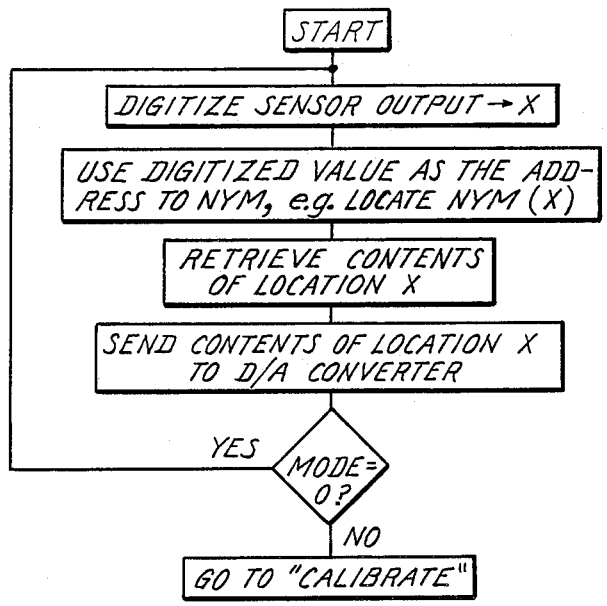
FIG. 4 is a flow chart of the present invention in the operate mode.

Turning to FIGS. 2 and 4, the apparatus 10 is depicted in the operate mode. As can be seen from FIG. 2, the components necessary for calibration are removed (e.g. the reference transducer with its signal conditioning circuit and the motor and its drive circuit.)

In the operate mode, a reference value is generated that is an accurate representation of the angular position of the shaft 26. The sensor signals are adjusted for offset and gain in real time using the value store during calibration (FIG. 3). As shown in FIG. 4, the sensor signals are digitized and combined to form the memory address which locates the desired reference value. After identifying the proper reference value, the memory contents (i.e. the reference value) is loaded to the D/A converter 32. The D/A converter 32 displays the output and the operate mode is repeated as long as the mode select mechanism 18 remains in the operate position.

The method and apparatus 10 of the present invention offers significant advantages in the use of sensors. An obvious criticism of the present invention is the necessity of using a reference transducer in the calibration stage. Upon reflection, however, this requirement is not a serious restriction. For example, in a biomedical application where the sensor is to be implanted, the reference transducer could be used to calibrate the sensor before implantation. The one time calibration could even be performed post-surgically after implant of the sensor to achieve the desired long term operation. A further advantage is that many reference transducers are somewhat invasive in that they must be directly coupled to the physical quantity being measured. In contrast, many sensors, such as the Hall-Effect sensors are noninvasive, having no affect on the physical quantity being measured.

A prime advantage of the method and apparatus 10 of the present invention is that sensor manufacturing costs would be reduced dramatically. By incorporating the apparatus 10 of the present invention (similar to a signal-condition system) the sensors could be fabricated with liberal tolerances. Further, sensors with unpredictable or undesirable performance characteristics — e.g. nonlinear sensors — could be used in widespread applications. An accurate or at least predictable performing reference transducer is used in the calibration stage. However, a single reference transducer is used to calibrate a large number of low costs sensors.

As projected, the method and apparatus 10 of the present invention could be used to replace the performance evaluation of each sensor type that normally occurs after manufacture. Thus, a one time calibration run would be made with the sensors subjected to the physical quantity of interest over the desired operational range and conditions with the reference transducer temporary connected. Manufacturing tolerances would be altered dramatically with subsequent reduction in costs.

I claim:

1. A method for conditioning the output characteristics of a sensor to conform to a desired transfer function, where the normal output of the sensor in measuring a physical quantity of interest deviates from the desired transfer function, comprising the steps of:
    (a) measuring the physical quantity in a first condition with a reference transducer having the desired transfer function;
    (b) measuring the physical quantity in the first condition with the sensor;
    (c) repeating steps (a) and (b) with the physical quantity in a plurality of different conditions;
    (d) building a changeable look-up table with the plurality of measurements of steps (a)-(c), where for each condition a sensor measurement corresponds to a reference transducer measurement conforming to the desired transfer function;
    (e) measuring the physical quantity in an unknown condition using the sensor;
    (f) conditioning the sensor measurement of step (e) to obtain an output conforming to the desired transfer function by adjusting the sensor output by providing real time feedback signals to obtain an adjusted sensor output and including the substeps
    determining a corresponding reference transducer measurement using the adjusted sensor output from the look-up table, and
    outputting the reference transducer measurement from the look-up table.

2. The method of claim 1, wherein the desired transfer function is linear and the sensor performs in a nonlinear fashion.

3. The method of claim 1, wherein in step (f) the reference transducer measurement is determined by interpolating between two reference transducer values in the look-up table.

4. The method of claim 3, wherein the desired transfer function is linear and the interpolation is linear.

5. The method of claim 1, wherein in step (b), including the step of measuring the physical quantity in the first condition with a second sensor.

6. The method of claim 5, wherein in step (d) for each condition a single reference transducer measurement corresponds to a unique pair of measurements from the first and second sensors.

7. A method for obtaining a linearized output from a sensor, where the sensor normally has an output that is a nonlinear function of the physical quantity being measured, comprising the steps of:
    calibrating the sensor by building a changeable look-up table for a plurality of conditions of the physical quantity in which the sensor signals correspond to linearized reference values, including the substeps of
    measuring the physical quantity in a plurality of conditions with both the sensor and a reference transducer that outputs a reference value that is a linear function of the physical quantity being measured, outputting for each condition a sensor signal and a reference value to establish a changeable look-up table with a unique reference value for each condition measured;

operating the sensor to obtain a linearized output corresponding to the physical quantity in an unknown condition including the substeps of measuring the physical quantity in the unknown condition with the sensor to produce a sensor signal, adjusting the sensor signal for gain and offset in real time, outputting the adjusted sensor signal to the look-up table, entering the look-up table with the adjusted sensor signal, determining a reference value that corresponds to the adjusted sensor signal and is a linear function of the physical quantity being measured, and outputting the reference value from the look-up table as the linearized output corresponding to the physical quantity in the unknown condition.

8. The method of claim 7, wherein said entering step includes:

determining the two sensor signal values in the look-up table nearest the entered sensor signal, linearly interpolating between the entered sensor signal and the two look-up table sensor signal values to determine an interpolation factor.

9. The method of claim 8, using the reference values corresponding to the two sensor signal values and applying the interpolation factor to the reference values to determine a reference value related to the sensor signal.

10. The method of claim 7, said calibrating step including enlarging said look-up table by interpolation based on said measured sensor signals and measured reference values to obtain interpolated sensor signals and corresponding interpolated reference values.

11. An apparatus to adjust the output of a sensor which produces an undesirable output signal in relation to changes in condition of a physical quantity being measured by the sensor, comprising:

reference means coupled to the physical quantity for producing an output which varies in a desirable fashion with changes in the condition of the physical quantity;

microprocessor means having a changeable look-up table for receiving the values of the sensor signals and reference means outputs, and for matching the values of the signals and outputs by adjusting the sensor output by providing realtime feedback signals to obtain an adjusted sensor output for a given physical quantity condition, including means for receiving an adjusted sensor signal indicative of the physical quantity in an unknown condition for determining a reference value from the look-up table using only the adjusted sensor signal of the unknown condition as the input; and means coupled to the microprocessor means for indicating the reference value.

12. An apparatus according to claim 11, said microprocessor means including means for determining portions of the changeable look-up table by interpolating to derive reference values.

13. The method of claim 7, said calibrating step including enlarging said look-up table by extrapolation based on said measured sensor signals and measured reference values to obtain extrapolated sensor signals and corresponding extrapolated reference signals.

14. A method of providing a measurement output which varies linearly with changes in a physical quantity being measured using a sensor having an output which varies nonlinearly with changes in the physical quantity being measured, comprising the steps of:

measuring the physical quantity in a plurality of conditions with the nonlinear sensor and with a linear transducer having an output which varies linearly with changes in the physical quantity being measured;

outputting a nonlinear sensor signal adjusted in real time for gain and offset and a linear transducer value for each condition measured to build a look-up table matching a linear transducer value with a nonlinear sensor signal for each condition measured;

measuring the physical quantity in an unknown condition with the nonlinear sensor to produce an object sensor signal;

comparing the object sensor signal with the look-up table sensor signals to identify a look-up table location;

retrieving the linear transducer value from the identified look-up table location; and outputting a measurement of the physical quantity in the unknown condition using said identified linear transducer value.

15. The method according to claim 14, including the step of expanding the look-up table beyond the measured nonlinear sensor signals and linear transducer values using interpolation.

16. The method according to claim 14, the comparing step including the steps of:

determining the two sensor signal values in the look-up table bounding the object sensor signal;

the retrieving step including the steps of:

retrieving the two bounding transducer values matching the two bounding sensor signal values;

approximating an object linear transducer value using the two bounding transducer values.

17. The method according to claim 15, the approximating step including the steps of:

interpolating between the two bounding signal values and the object sensor signal to determine an interpolation factor;

applying the interpolation factor to the two bounding transducer values to identify said object linear transducer value.

18. The apparatus according to claim 11, said microprocessor means including means for determining portions of the changeable look-up table by extrapolating to derive reference values.

19. The apparatus according to claim 11, said receiving and determining means being operable to use said sensor signal of the unknown condition as a pointer to the look-up table to determine said reference value.

20. The apparatus according to claim 11, said sensor signals being analog and said receiving and determining means including an analog-to-digital converter.

21. The apparatus according to claim 11, said reference means being decoupleable from said physical quantity and from said microprocessor means.

* * * * *